United States Patent [19]

Hayden

[11] Patent Number: 5,418,393
[45] Date of Patent: May 23, 1995

[54] THIN-FILM TRANSISTOR WITH FULLY GATED CHANNEL REGION

[75] Inventor: James D. Hayden, Austin, Tex.

[73] Assignee: Motorola, Inc., Schaumburg, Ill.

[21] Appl. No.: 158,560

[22] Filed: Nov. 29, 1993

[51] Int. Cl.$^6$ .................. H01L 27/01; H01L 29/04; H01L 27/11

[52] U.S. Cl. .................. 257/347; 257/57; 257/66; 257/350; 257/903

[58] Field of Search .......... 257/57, 59, 66, 72, 257/347, 350, 351, 352, 353, 67, 69, 903, 904

[56] References Cited

U.S. PATENT DOCUMENTS

| | | | |
|---|---|---|---|
| 4,980,732 | 12/1990 | Okazawa | 357/23.5 |
| 5,158,898 | 10/1992 | Hayden et al. | 437/21 |
| 5,235,189 | 8/1993 | Hayden et al. | 257/329 |
| 5,270,968 | 12/1993 | Kim et al. | 365/182 |
| 5,285,093 | 2/1994 | Lage et al. | 257/903 |

FOREIGN PATENT DOCUMENTS

| | | | |
|---|---|---|---|
| 63-260162 | 10/1988 | Japan | 257/344 |
| 1-57655 | 3/1989 | Japan | 257/67 |

OTHER PUBLICATIONS

Kazuo Itabashi et al., "A Split Wordline Cell for 16Mb SRAM Using Polysilicon Sidewall Contacts", Dec. 8–11, 1991 IEDM, pp. 477–479.

Primary Examiner—Steven Ho Yin Loke
Attorney, Agent, or Firm—Patricia S. Goddard

[57] ABSTRACT

A semiconductor device (10) has a thin-film transistor (TFT) formed in and around an opening (24) in a dielectric layer (22). A conductive layer (26) lines the opening sidewalls and serves as a gate electrode of the transistor. A conductive layer (30) is deposited over the gate electrode to form a source region (32), a channel region (36), and a drain region (34). The two conductive layers are separated by a gate dielectric (28). Because both the gate electrode and the channel region conform to the opening sidewalls and bottom, the entire channel region is under direct gate control. Device (10) may also include a conductive region, such as a gate electrode (15) of a bulk transistor, at the bottom of opening (24) and in electrical contact with the TFT gate electrode.

19 Claims, 4 Drawing Sheets

THIN-FILM TRANSISTOR WITH FULLY GATED CHANNEL REGION

Cross-Reference to a Related Application

The present invention is related to a commonly assigned, co-pending patent application entitled, "Semiconductor Device Having Increased Capacitance and Method for Making the Same," by James D. Hayden, Ser. No. 08/158,552, Nov. 29, 1993.

1. Field of the Invention

The present invention relates to semiconductor devices generally, and more specifically to semiconductor devices having thin-film transistors (TFTs), and methods for making the same.

2. Background of the Invention

TFTs are evolving as an important design tool in semiconductor devices, particularly in memory devices. In fast static random access memories (FSRAMs) in particular, TFTs have become accepted due to the following advantages of these transistors over the use of conventional polysilicon load resistors: 1) less array current leakage and less parasitic standby current; 2) lower occurrences of leakage-induced soft errors; 3) increased cell capacitance; and 4) higher logic "on" voltage.

One type of known TFT is called an "under-gated" TFT. In an under-gated TFT, a gate electrode lies beneath source and drain regions, as opposed to lying above the source and drain region as in an "over-gated" TFT. An advantage of under-gated TFTs as compared to over-gated TFTs is the ability to achieve a higher packing density, resulting in smaller cell areas. However, under-gated TFT structures can have performance disadvantages as compared to over-gated TFTs and bulk transistors. A significant disadvantage is characterized as "short-channel" behavior. As a result of "short-channel" behavior, the leakage current through the TFT under off-state conditions becomes higher than desired. Additionally, the spread in the device characteristics increases.

The short-channel behavior is created in conventional TFTs because typically only a portion of the channel region is controlled by the gate electrode. In other words, the channel width is wider than the gate electrode. Structurally, these conventional under-gated TFTs have a gate electrode formed at the bottom of an opening in a dielectric layer (sometimes called a "gate hole"). A gate oxide layer is formed on top of the gate electrode, and a polysilicon layer is deposited such that it conforms to the top of the dielectric layer, the sidewalls of the opening, and the bottom of opening. This polysilicon layer is used to form source and drain regions on top of the dielectric layer and a channel region conforming to the opening sidewalls. The differential between the gate width and the channel length is due to the fact that the gate electrode width is equal to the width of the opening, whereas the channel length is equal to the width of the opening plus about twice the height of the opening sidewalls. Accordingly, the portion of the channel lying along the sidewalls of the opening is not directly controlled by the gate electrode.

In light of the disadvantages of "short-channel" behavior in conventional under-gated TFT structures, there is a need for a TFT having a longer portion of the channel region directly controlled by the gate electrode.

SUMMARY OF THE INVENTION

In one form, the present invention is a thin-film transistor, for example in a semiconductor device. The transistor is formed in an opening in a dielectric layer. The opening has sidewalls and a bottom. A gate electrode of the thin-film transistor is formed along the sidewalls and bottom of the opening. A gate dielectric is formed on the gate electrode. A conductive layer overlies the gate dielectric layer and the gate electrode. The conductive layer comprises a source region, a drain region, and a channel region of the thin-film transistor. A method for making such a thin-film transistor is included as another form of the invention.

These and other features of the invention will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

The present invention overcomes many of the disadvantages of short-channel behavior in a thin-film transistor (TFT) by utilizing the geometry of an opening in a dielectric layer to increase channel length. In one embodiment, a gate electrode conforms to an opening in a dielectric layer. The gate electrode has an overlying gate dielectric layer formed thereon. A conductive layer is deposited to conform to the gate electrode such that upon forming source and drain regions in the conductive layer, a channel region is created which coincides with the conformal gate electrode, and is therefore fully gated. In one conventional under-gated TFT structure which also utilizes an opening in a dielectric layer, the channel region length is equal to the width of the bottom of the opening plus the height of each sidewall of the opening. However, the gate width in such a structure is only equal to the width of the bottom of the opening, such that only a fraction of the channel region is under the direct control of the gate electrode, or "gated," during device operation. With the present invention, the entire channel length, along each opening sidewall and along the bottom of the opening, is fully gated. This increase in controlled channel length overcomes short-channel effects, yet is easily integrated into existing process flows for semiconductor devices such as those used in SRAM devices.

Figure 1:
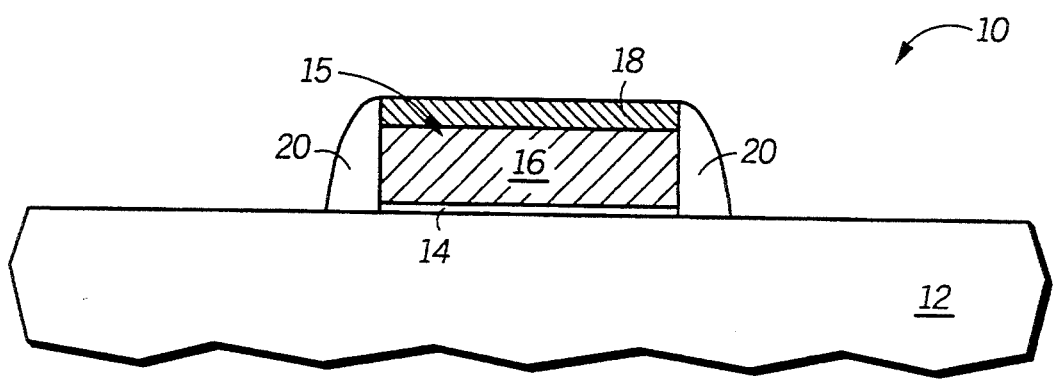
FIGS. 1-5 illustrate, in cross-section, sequential processing steps for making a thin-film transistor in a portion of a semiconductor device in accordance with the present invention.

FIG. 1 illustrates, in cross-section, a portion of a suitable semiconductor device 10 within which to build a TFT in accordance with the present invention, although other structures are also suitable. In one embodiment of the invention, device 10 is a portion of an SRAM cell in an integrated circuit. Device 10 includes a semiconductor substrate 12 which is preferably a semiconducting wafer of, for instance, silicon. Substrate 12, however, may be any layer of semiconductor device, including either an insulating layer or a conductive layer. A gate dielectric 14, such as an oxide, a nitride, or an oxynitride combination, overlies substrate 12. Above gate dielectric 14 is a gate electrode 15 which includes a polysilicon layer 16 and an overlying silicide layer 18. It should be noted that the silicide layer 18 is not essential to the invention. Gate electrode 15 is a gate electrode for a bulk transistor fully present in another portion of device 10. A bulk transistor is one in which current electrodes (source and drain electrodes) are formed in the bulk of a semiconductor substrate, rather than in overlying layers such as in TFT structures. For purposes of understanding the present invention, the bulk transistor for gate electrode 15 is not necessary and therefore is not fully illustrated or described. Dielectric sidewall spacers 20 are formed adjacent gate electrode 15. The structure of device 10 as illustrated in FIG. 1 is formed using conventional complementary metal-oxide-semiconductor (CMOS) processing technology which is readily understood by those having ordinary skill in the art of CMOS semiconductor processing. Accordingly, further discussion on how the structure illustrated in FIG. 1 is not necessary.

Figure 2:
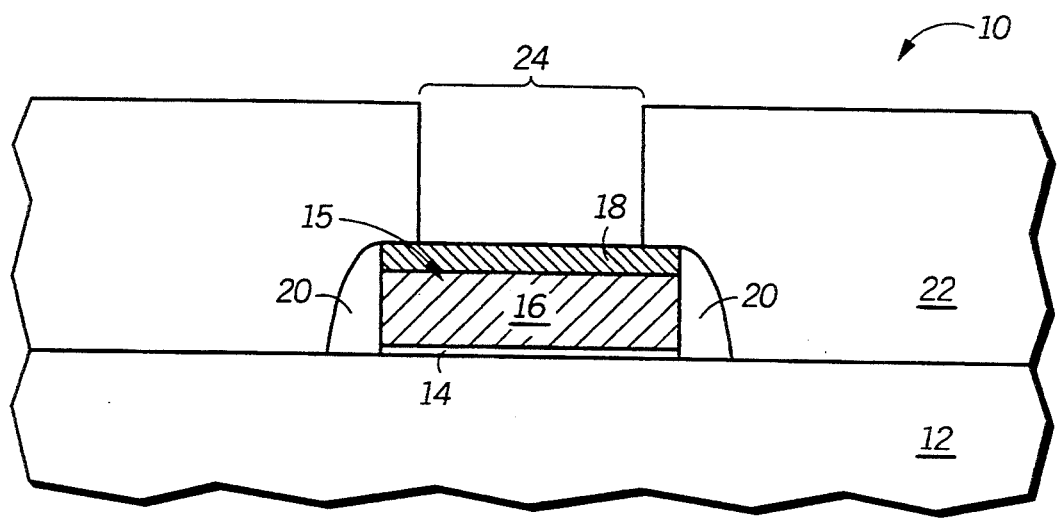

As illustrated in FIG. 2, and in accordance with one embodiment of the present invention, a dielectric layer 22 is deposited over device 10 and is patterned to form an opening 24 which exposes a portion of gate electrode 15. Dielectric layer 22 may be $SiO_2$, phospho-silicate glass (PSG), boron-doped PSG (BPSG), tetra-ethyl-ortho-silicate (TEOS), spin-on-glass (SOG), or other dielectric material used in semiconductor fabrication. If dielectric material 22 is doped, it is important to consider the effects of the dopant on subsequently deposited conductive layers in the TFT. An additional dielectric layer may be required in the event material 22 is doped in order to prevent counterdoping of the subsequent TFT polysilicon layers. Opening 24 is formed in dielectric layer 22 using conventional lithographic and etching techniques, such as using a photoresist mask in conjunction with an anisotropic etch. Rather than etching through a blanket layer of dielectric material 22, which would require an alignment step, a sacrificial plug material may be formed on top of, and self-aligned to, gate electrode 15 prior to depositing a planarizing dielectric layer 22. The sacrificial plug is subsequently removed, selectively to dielectric layer 22, to create opening 24. Furthermore, any available processing methods for forming openings in semiconductor devices can be used to form opening 24. Opening 24 has sidewalls defined by dielectric layer 22 and a bottom defined by gate electrode 15. At this point it is useful to note that a TFT in accordance with the present invention may be formed without an underlying gate electrode or even without an underlying substrate. Simply a dielectric material having an opening formed therein is sufficient to make a TFT in accordance with the invention. If gate electrode 15 is omitted, the bottom of the opening may be defined by underlying substrate 12. Furthermore, the bottom of opening 24 may be defined by dielectric layer 22 by terminating any etch used to form the opening before reaching any underlying layers.

Figure 3:
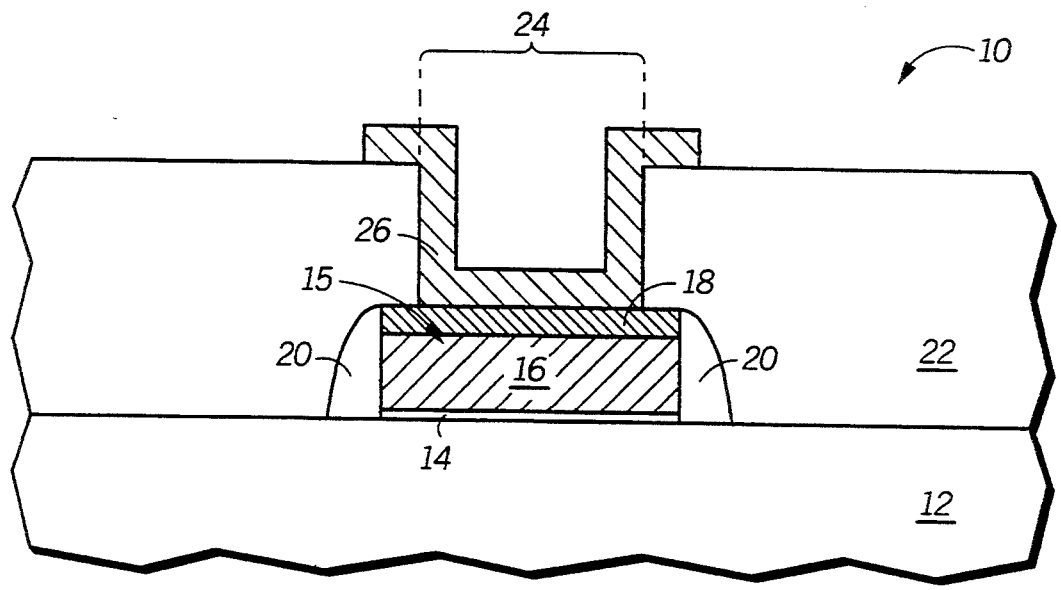

After forming opening 24, a conductive layer 26 is deposited and patterned to form a gate electrode of a TFT in accordance with the present invention, as illustrated in FIG. 3. Preferably, conductive layer 26 is polysilicon, and is patterned using conventional lithographic and etching techniques. Conductive layer 26 may by itself act as the gate electrode of a TFT, or may function in conjunction with any underlying conductive region, such as underlying gate electrode 15. If an underlying conductive region or member is present, conductive layer 26 may be both physically and electrically in contact with the underlying conductive region, as illustrated in FIG. 3. Conductive layer 26 extends along the sidewalls of opening 24 such that the gate electrode of an under-gated TFT in accordance with the present invention is not confined to the bottom of the opening as in many prior art devices.

Figure 4:
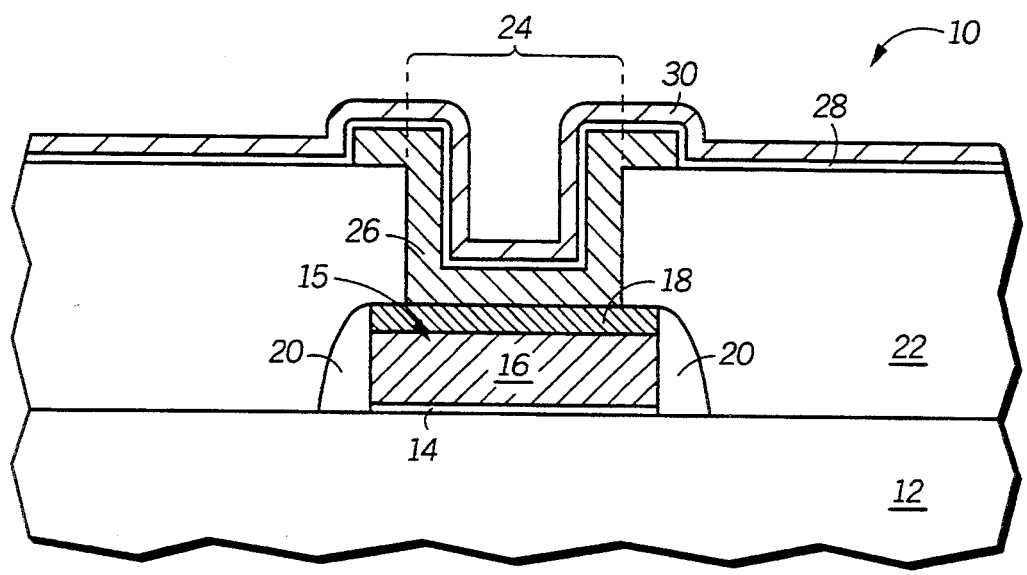

As illustrated in FIG. 4, a gate dielectric 28 is then formed over conductive layer 26. Gate dielectric 28 may be either thermally grown, in which case it will only cover conductive layer 26, or may be deposited, in which case it will cover both conductive layer 26 and dielectric layer 22 as illustrated in FIG. 4. Suitable materials for gate dielectric 28 include conventional gate dielectric materials, such as $SiO_2$, $Si_3N_4$ or a combination of these. As with most gate dielectrics, layer 28 should be kept as thin as reliably and manufacturably possible for optimal transistor operation.

Figure 5:
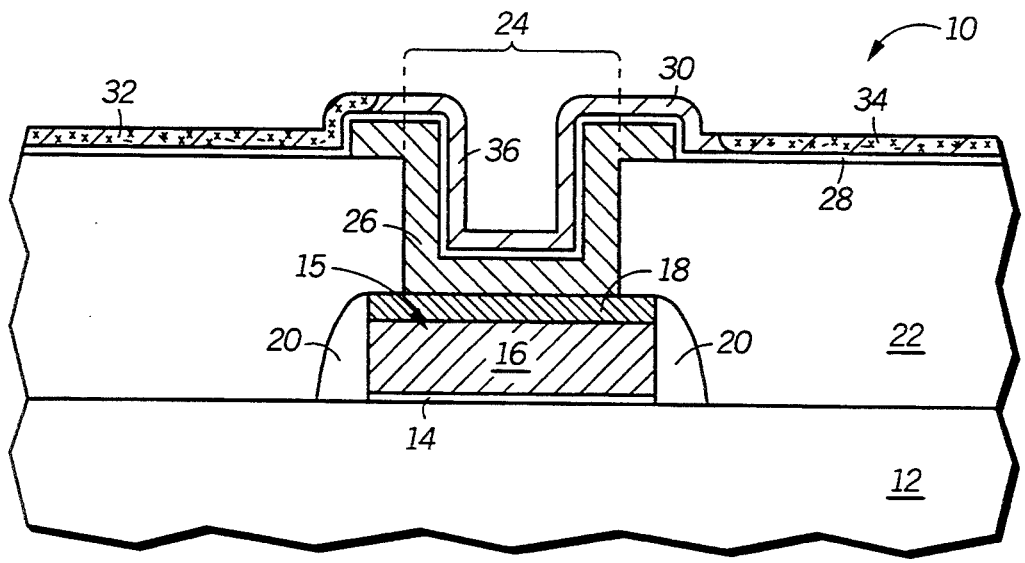

Next, a conductive layer 30 is deposited over gate dielectric 28. Conductive layer 30 is also preferably polysilicon, and is used to form current electrodes and a channel region of a TFT in accordance with the present invention. As illustrated in FIG. 5, conductive layer 30 is doped to form a source region 32 and a drain region 34. Separating the source and drain regions is a channel region 36. Source and drain regions 32 and 34 are formed by ion implantation, diffusion, knock-in, auto-doping, or other doping technique used in semiconductor manufacturing. As illustrated in FIG. 5, source region 32 partially overlies conductive layer 26, which is the gate electrode of the TFT, while drain region 34 is slightly offset from conductive layer 26. This configuration of the source and drain region achieves the advantage of reducing the off-state leakage current of the TFT and lowering the stand-by current of the circuit. To achieve this asymmetric source and drain alignment, one is likely to employ a masking step to mask channel region 36 followed by an implant step. To avoid a masking step, source and drain regions 32 and 34 can be self-aligned by diffusing dopants from a doped dielectric layer 22 (preferably gate dielectric would not separate the current electrode regions from dielectric layer 22 in this case, for example it is thermally grown over only conductive layer 26). However, having the source and drain regions self-aligned eliminates the advantages of the asymmetric current electrode configuration discussed above.

As is evident from FIG. 5, device 10 includes a TFT in accordance with the present invention which has a fully gated channel region. The TFT includes a gate electrode (formed by conductive layer 26 and, if present, gate electrode 15), source region 32, drain region 34, channel region 36, and gate dielectric 28. Because both the channel region 36 and gate electrode (conductive layer 26) of the TFT extend along the sidewalls and bottom of opening 24, the channel is fully gated by conductive layer 26, with the exception of a small portion of the channel next to the drain which is intentionally offset from the gate electrode in one embodiment of the invention. In a prior art under-gated TFT, conductive layer 26 is not present, so that only the portion of the channel at the bottom of the opening would be gated by an underlying gate electrode, such as electrode 15. Accordingly, portions of the channel region next to the sidewalls of the opening were not gated. The result of this prior art TFT was an increase in the source parasitic resistance and a decrease in the on-state current of the TFT. These effects are significantly reduced since the gated portion of the channel region is increased with the present invention. Note that the amount of increase in gated channel length depends on the dimensions of opening 24.

Figure 6:
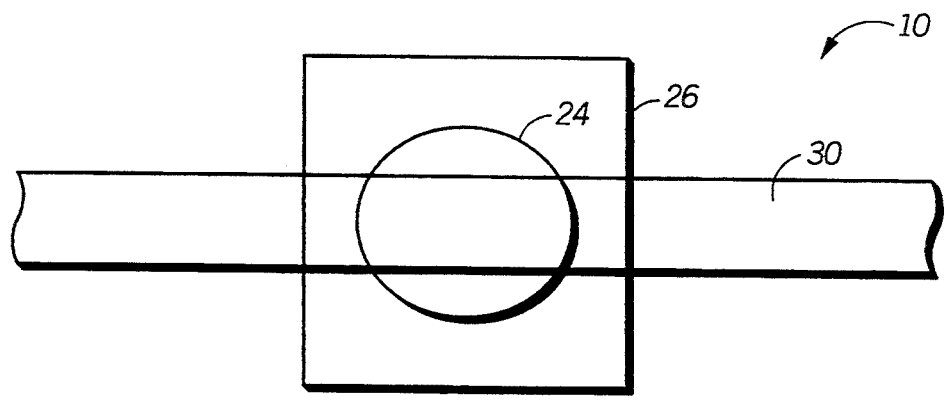
FIG. 6 illustrates the thin-film transistor of FIG. 5 in a top-down view.

FIG. 6 is a top-down view of device 10 which demonstrates an additional advantage in using a TFT in accordance with the present invention, namely relaxation of alignment tolerances. As illustrated in FIG. 6, conductive layer 26 which forms the gate electrode of the TFT, encompasses opening 24 through dielectric layer 22. It is important to note that while conductive layer 26 is confined to the region surrounding opening 24 in device 10, conductive layer 26 in other embodiments may extend to another portion of the device, rather than only surround the opening. For example, if there is no underlying conductive region to which the gate electrode of the TFT is connected (e.g. no underlying gate electrode 15), then conductive layer 26 will have to extend to another region of the device to enable the gate to turn the TFT transistor on and off.

As a result of the configuration illustrated in FIG. 6, portions of conductive layer 26 remain on the top surface of dielectric layer 22 surrounding opening 24, as illustrated in FIG. 5. Due the geometric configuration of, and relationship between, conductive layer 26 and opening 24, there is a relatively large alignment tolerance window for lithographic processing. A slight misalignment of the two features is not critical. Similarly, conductive layer 30 which forms the channel, source, and drain regions of the TFT can be misaligned in any direction relative to opening 24 and conductive layer 26 without adversely impacting performance of the TFT. Moreover, any concern about etching conductive layer 30 into a fine line as illustrated in FIG. 6 without leaving what are known as "stringers" inside opening 24 is not an issue. Any conductive stringers which might be left within the opening are electrically isolated from the gate electrode and are fully gated by conductive layer 26.

Figure 7:
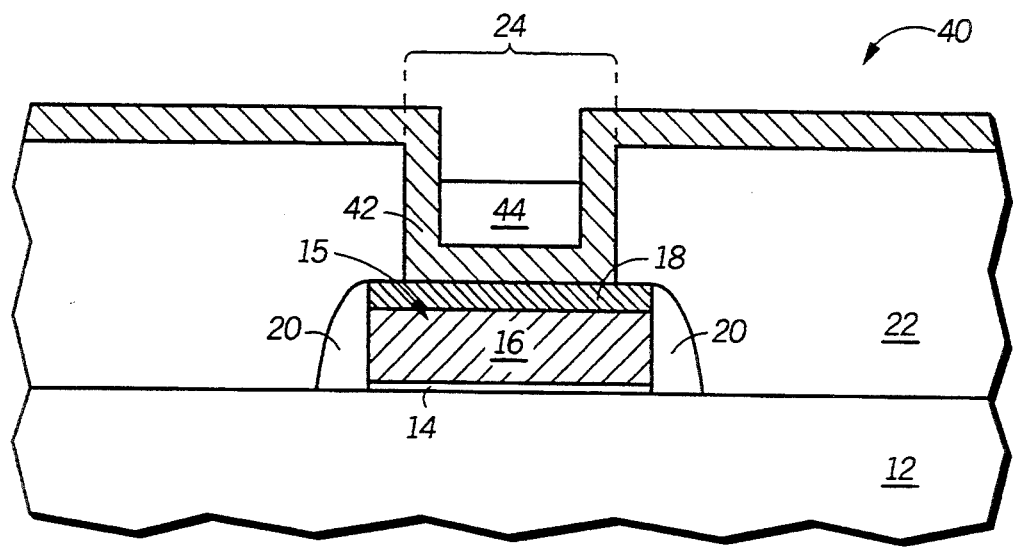
FIGS. 7-10 illustrate, in cross-section, an alternative processing sequence for making a thin-film transistor also in accordance with the present invention.

FIGS. 7-10 illustrate an alternative process flow for making, and a resulting structure of, a TFT in accordance with the present invention. A portion of the semiconductor device 40, such as an SRAM cell, in which a TFT is to be fabricated is illustrated in FIG. 7. Since many of the elements already described are also included in device 40, the same reference numerals are used and corresponding descriptions are omitted. Upon forming opening 24 in dielectric layer 22, which exposes gate electrode 15 if present, a conductive layer 42, for example polysilicon, is deposited conformal to the opening. Next, a sacrificial plug 44 is formed in the bottom portion of the opening. The purpose of the plug is to prevent etching of conductive layer 42 at the bottom of the opening during a subsequent etching step. Plug 44 is of any material which can be etched selectively to conductive layer 42. Also, plug 44 needs to be of a material which can be etched selectively to dielectric layer 22, for reasons to become apparent in the context of FIG. 8. One suitable material for plug 44 is photoresist, although other materials common to semiconductor manufacturing having the necessary etch selectivity may instead be used. A convenient method for forming plug 44 is to deposit, or otherwise form, a substantially planar material, followed by a uniform etch-back back, wherein the etch is terminated prior to removing all of the dielectric material from within the opening. The height of sacrificial plug within opening 24 should be controlled to achieve the desired profile of conductive layer 42 upon etching, as discussed below.

Figure 8:
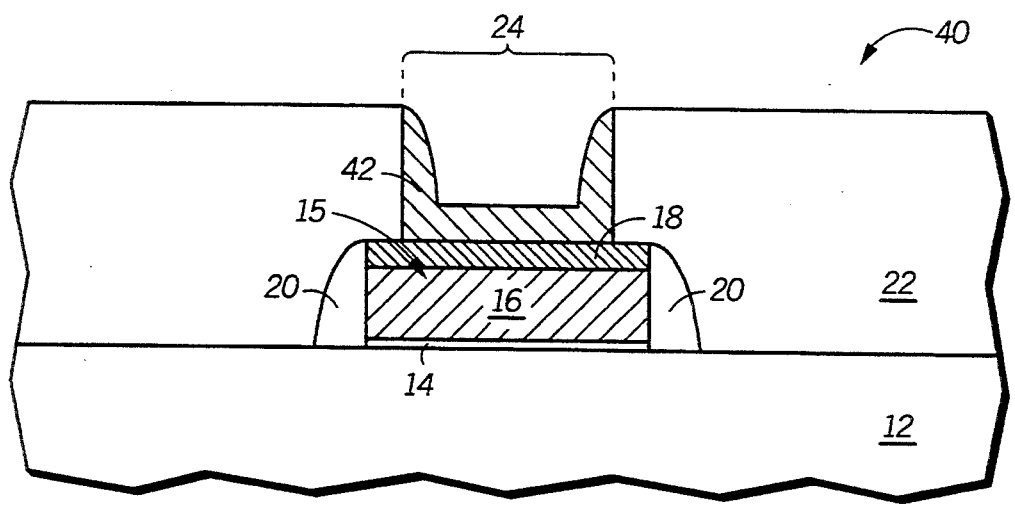

Upon forming plug 44, conductive layer 42 is etched to remove conductive layer 42 from the top surface of dielectric layer 22, as illustrated in FIG. 8. This etch also etches to some extent the portions of conductive layer 42 along the sidewalls of opening 24, leaving a tapered conductive sidewall appearance. Due to the present of sacrificial plug 44, the portion of the conductive layer 42 along the bottom of opening 24 is left unaffected by the etch. As a result of etching conductive layer 42, a gate electrode for the TFT is effectively completely contained within opening 24 (i.e. does not extend beyond the perimeter of the opening). With such a process, the TFT gate electrode is self-aligned to opening 24 so that no separate lithography masking step is required to define the gate electrode. After conductive layer 42 is etched to form the TFT gate electrode, sacrificial plug 44 is removed. Thus, as mentioned above, there is a need for the plug to be removable from opening 24 selectively to both conductive layer 42 and dielectric layer 22.

At this point, remaining fabrication steps to form a TFT in accordance with the present invention may proceed as described and illustrated with respect to FIGS. 4 and 5. Alternatively, remaining elements of the TFT can be formed in a self-aligned manner as now described in reference to FIGS. 9 and 10. (Likewise, in place of the process steps illustrated in FIGS. 4 and 5, device 10 can alternatively be fabricated as described below.)

Figure 9:
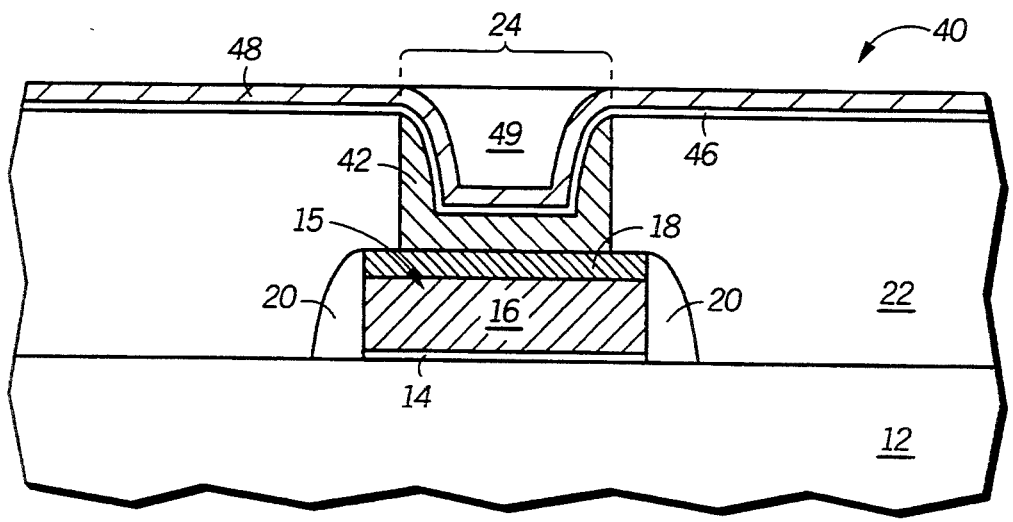
Figure 10:
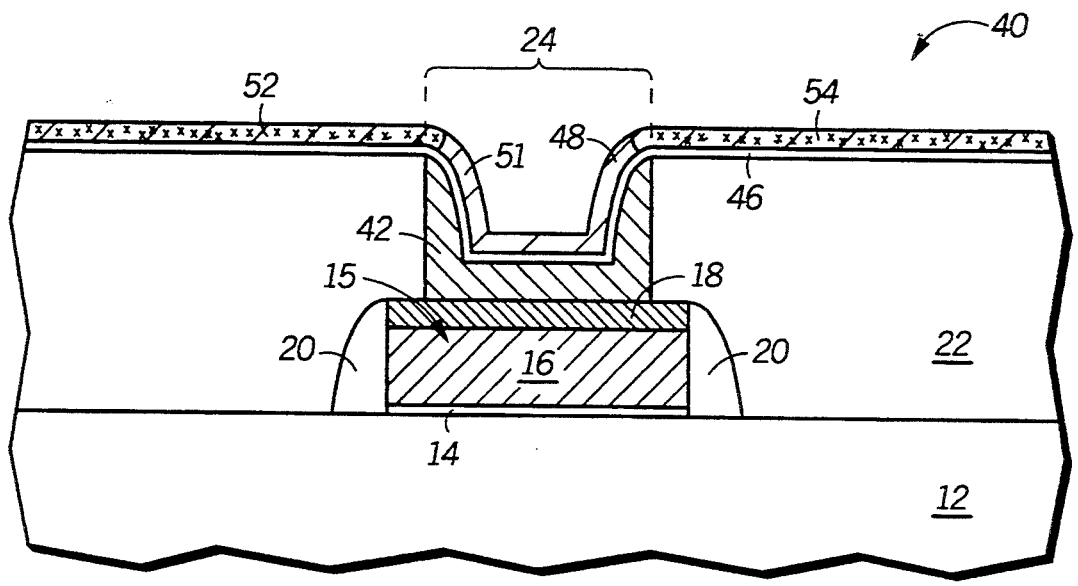

Once the gate electrode for the TFT is defined, a gate dielectric 46 and a conductive layer 48 are deposited, or otherwise formed, as illustrated in FIG. 9. Conventional gate dielectric materials and formation techniques are suitable for use in device 40. Similarly, conductive layer 48 may be of conventional TFT materials, such as polysilicon. Next, another sacrificial plug 49 is formed within opening 24. Here, plug 49 preferably fills the opening but should not cover portions of conductive layer 48 outside of opening 24. Plug 49 is of a material which can be etched selectively to conductive layer 48, and can be formed using a planar deposition and etchback technique as discussed in reference to plug 44. Plug 49 is used to shield portions of conductive layer 48 to prevent doping during a subsequent ion implantation step. The resulting structure following implantation is illustrated in FIG. 10. The portions of conductive layer 48 shielded by plug 49 during implantation will form a channel region 51 of the TFT, while unshielded portions will be doped to form source and drain regions 52 and 54, respectively. Accordingly, the source and drain regions are self-aligned. The fabrication simplicity associated with self-aligned source and drains may compensate, in some devices, for a degradation in transistor performance in not having the source and drain asymmetric to the gate electrode as described earlier. After implantation, plug 49 may be removed from the opening, or may remain. An advantage of keeping plug 49 in the opening is that it planarizes device 40 to make additional fabrication steps easier. It is important to also note that self-aligned source and drain regions can be achieved in device 40 without the use of plug 49 by using a doped glass for dielectric layer 22 and diffusing dopants from dielectric layer 22 into conductive layer 48.

Figure 11:
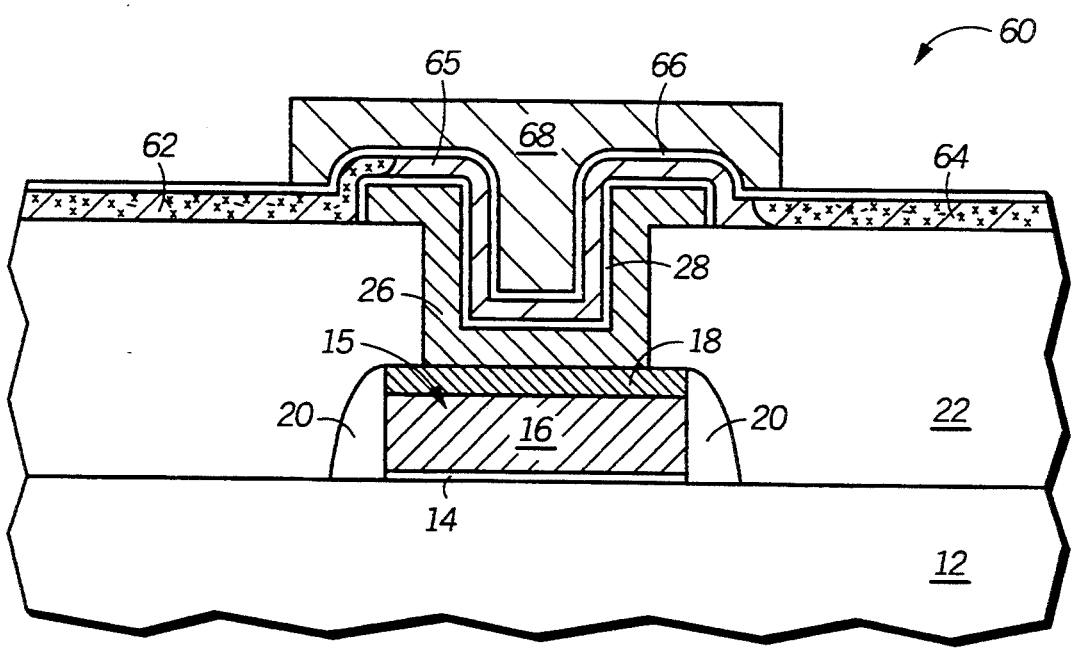
FIG. 11 illustrates in cross-section a double-gated thin-film transistor in accordance with the present invention.

FIG. 11 illustrates, in cross-section, another embodiment of the present invention which is a double-gated TFT structure in a portion of a semiconductor device 60, such as an SRAM cell. Device 60 is fabricated using any of the previously described process flows, or variations thereof, up to the point of forming a source region 62, a drain region 64, and a channel region 65. (Note that gate dielectric 28 in device 60 only covers conductive layer 26 which facilitates diffusion of dopants from dielectric layer 22 if diffusion is employed to form the source and drain regions 62 and 64). Once the source and drain regions are formed, a second gate dielectric 66 is deposited, or otherwise formed, over the source, drain, and channel regions. Next, a conductive layer 68, such as polysilicon, is deposited and patterned to form a second gate electrode of the TFT overlying second gate dielectric 66. Thus, the transistor channel region 65 is gated by both conductive layer 26 from the bottom side and by conductive layer 68 from the top side. A double-gated transistor such as that illustrated in FIG. 11 has performance advantages over comparable single-gated transistors. Specifically, improved off-state and on-state TFT currents are achieved. Whether or not to use a double-gated transistor in place of a single-gated one, like other design choices, is usually determined by analyzing whether the performance enhancement is worth the additional fabrication steps necessary.

The foregoing description and illustrations contained herein demonstrate many of the advantages associated with the present invention. In particular, it has been revealed that a TFT in accordance with the present invention overcomes many of the deficiencies of prior art devices by forming a gate electrode extension in a dielectric opening which permits nearly the entire channel region of the TFT to be under direct gate control. The increase in gated channel length significantly reduces the likelihood of soft-errors caused by alpha particle impingement. Moreover, the present invention can be used in a semiconductor device, such as an SRAM cell, without any increase in cell size. Furthermore, several process steps for forming a TFT in accordance with the present invention have favorable alignment tolerance windows. Also, additional processing steps from those already used in semiconductor manufacturing are minimal. The present invention can be easily incorporated into existing memory cell designs and process flows which now employ other TFT structures. For example, many existing designs require the formation on openings in dielectric layers in order to contact underlying conductive regions. The present invention can be used to occupy such openings with active devices, thereby gaining a performance improvement without an increase in size.

Thus it is apparent that there has been provided, in accordance with the invention, a thin-film transistor having a fully gated channel region and method for making the same that fully meets the needs and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, as discussed previously, it is not essential that a TFT of the present invention be formed on top of a gate electrode of a bulk transistor. Rather, a TFT can be formed solely in a dielectric material, or may be formed in contact with any underlying conductive region, such as a doped substrate region or a conductive layer in a semiconductor device. In addition, the invention is not limited to forming a TFT with a semiconductor substrate. For instance, a TFT may be formed in a glass substrate for liquid crystal display applications. Furthermore, a TFT in accordance with the present invention could be used in other types of memory circuits such as dynamic random access memories (DRAMs) and electrically erasable read-only memories (EEPROMs). Therefore, it is intended that this invention encompass all such variations and modifications as fall within the scope of the appended claims.

I claim:

1. A thin-film transistor comprising:
   a dielectric layer having an opening formed therein, the opening having sidewalls formed by the dielectric layer and a bottom;
   a gate electrode conformally formed from near the top of the opening along the sidewalls and bottom of the opening such that portions of the gate electrode along the sidewalls of the opening extend higher than a portion of the gate electrode along the bottom of the opening and such that the gate electrode is formed without completely filling the opening;
   a gate dielectric formed on the gate electrode; and
   a conductive layer overlying the gate dielectric and the gate electrode, the conductive layer comprising a source region, a drain region, and a channel region, wherein a portion of the channel region lies within the opening and extends approximately to the top of the opening.

2. The thin-film transistor of claim 1 wherein the conductive layer is substantially conformal to the gate electrode within the opening such that nearly all of the channel region is gated by the gate electrode.

3. The thin-film transistor of claim 1 wherein the dielectric layer has a top surface adjacent the sidewalls of the opening, and wherein the gate electrode extends beyond the opening and onto the top surface of the dielectric layer.

4. The thin-film transistor of claim 1 wherein the gate electrode is nearly entirely contained within the opening.

5. The thin-film transistor of claim 4 wherein the source region and drain region are self-aligned to the gate electrode.

6. The thin-film transistor of claim 1 wherein the gate electrode is a first gate electrode, and further comprising a second gate electrode underlying the dielectric layer and defining the bottom of the opening in the dielectric layer, wherein the first and second gate electrodes are in electrical contact with each other at the bottom of the opening.

7. The thin-film transistor of claim 6 wherein the second gate electrode is a gate electrode of a bulk transistor.

8. The thin-film transistor of claim 6 wherein the first and second gate electrodes and the conductive layer each comprise polysilicon.

9. A thin-film transistor in a semiconductor device comprising:
- a semiconductor substrate having an overlying conductive portion;
- a dielectric layer overlying the substrate and the conductive portion;
- an opening in the dielectric layer to expose a portion of the conductive portion, the opening having sidewalls formed by the dielectric layer and a bottom formed by the conductive portion;
- a gate electrode formed along the sidewalls and bottom of the opening and in electrical contact with the conductive portion, wherein portions of the gate electrode along the sidewalls of the opening extend higher than a portion of the gate electrode along the bottom of the opening;
- a gate dielectric formed on the gate electrode; and
- a conductive layer overlying the dielectric layer and the gate dielectric, the conductive layer substantially conforming to the gate electrode within the opening and comprising a source region, a drain region, and a channel region.

10. The thin-film transistor of claim 9 wherein the gate electrode extends beyond the opening and onto a top surface of the dielectric layer, and wherein the source region partially overlies the gate electrode and the drain region is offset from the gate electrode.

11. The thin-film transistor of claim 9 wherein the gate electrode is nearly entirely contained within the opening.

12. The thin-film transistor of claim 11 wherein the source region and drain region are self-aligned to the gate electrode, and wherein all of the channel region is gated by the gate electrode.

13. The thin-film transistor of claim 9 wherein the thin-film transistor is a double-gated thin-film transistor, and further comprising:
- an additional gate dielectric overlying the conductive layer; and
- an additional gate electrode overlying the additional gate dielectric.

14. The thin-film transistor of claim 9 wherein the gate electrode and the conductive layer comprise polysilicon.

15. The thin-film transistor of claim 14 wherein the conductive portion overlying the substrate comprises polysilicon.

16. The thin-film transistor of claim 15 wherein the conductive portion is a gate electrode of a bulk transistor in the semiconductor device.

17. The thin-film transistor of claim 9 wherein the gate electrode is conformal to the sidewalls and bottom of the opening, without completely filling the opening.

18. The thin film transistor of claim 9 wherein nearly all of the channel region of the conductive layer is gated by the gate electrode.

19. The thin film transistor of claim 9 wherein all of the channel region of the conductive layer is gated by the gate electrode.

* * * * *